(12) United States Patent
Mikhaylichenko et al.

(10) Patent No.: US 8,324,114 B2
(45) Date of Patent: Dec. 4, 2012

(54) METHOD AND APPARATUS FOR SILICON OXIDE RESIDUE REMOVAL

(75) Inventors: Katrina Mikhaylichenko, San Jose, CA (US); Denis Syomin, Villach (AT)

(73) Assignee: Lam Research Corporation, Fremont, CA (US)

( * ) Notice: Subject to any disclaimer, the term of this patent is extended or adjusted under 35 U.S.C. 154(b) by 227 days.

(21) Appl. No.: 12/788,134

(22) Filed: May 26, 2010

(65) Prior Publication Data
US 2011/0294299 A1    Dec. 1, 2011

(51) Int. Cl.
*H01L 21/302* (2006.01)
(52) U.S. Cl. .......... 438/756; 438/745; 134/1.2; 216/103
(58) Field of Classification Search .......... 438/745, 438/750, 756, 757; 134/1.2, 1.3, 3; 216/83, 216/103
See application file for complete search history.

(56) References Cited

U.S. PATENT DOCUMENTS

| | | | |
|---|---|---|---|
| 6,453,914 B2 | 9/2002 | Torek et al. | |
| 6,488,040 B1 | 12/2002 | de Larios et al. | |
| 6,517,738 B1 | 2/2003 | Torek et al. | |
| 6,562,726 B1 | 5/2003 | Torek et al. | |
| 6,783,695 B1 | 8/2004 | Torek et al. | |
| 7,067,466 B2 | 6/2006 | Yates et al. | |
| 7,169,695 B2 | 1/2007 | Huang et al. | |
| 7,226,868 B2 | 6/2007 | Mosden et al. | |
| 7,234,477 B2 | 6/2007 | de Larios et al. | |
| 7,235,188 B2 | 6/2007 | Daviot et al. | |
| 7,261,835 B2 * | 8/2007 | Torek et al. | 252/79.1 |
| 7,294,580 B2 | 11/2007 | Yun et al. | |
| 7,329,321 B2 | 2/2008 | Yun et al. | |
| 7,389,783 B2 | 6/2008 | Woods et al. | |
| 7,406,972 B2 | 8/2008 | Woods et al. | |
| 7,597,765 B2 | 10/2009 | Zhu et al. | |
| 7,632,376 B1 | 12/2009 | Ravkin et al. | |
| 2002/0137357 A1 | 9/2002 | Chen et al. | |
| 2003/0069151 A1 | 4/2003 | Ye et al. | |
| 2005/0000545 A1 | 1/2005 | Inagaki | |
| 2006/0003523 A1 * | 1/2006 | Haupt | 438/238 |
| 2006/0172906 A1 | 8/2006 | Wu et al. | |
| 2007/0026677 A1 | 2/2007 | Ji et al. | |
| 2007/0240737 A1 * | 10/2007 | Zhu et al. | 134/2 |
| 2009/0001314 A1 * | 1/2009 | Yates | 252/79.1 |

FOREIGN PATENT DOCUMENTS
WO    WO 2009/058278 A1    5/2009
* cited by examiner

*Primary Examiner* — Lan Vinh
(74) *Attorney, Agent, or Firm* — Beyer Law Group LLP

(57) ABSTRACT

A method for removing silicon oxide based residue from a stack with a doped silicon oxide layer with features with diameters less than 100 nm is provided. A wet clean solution of between 25% to 60% by weight of $NH_4F$, and between 0.05% and 5% by weight of phosphoric acid, and between 0.05% and 5% by weight citric acid, in a water solvent is provided to an area on a surface of the stack. The wet clean solution is removed from the area on the surface of the stack between 0.5 to 10 seconds after the area on the surface of the stack was exposed to the wet clean solution.

18 Claims, 5 Drawing Sheets

METHOD AND APPARATUS FOR SILICON OXIDE RESIDUE REMOVAL

BACKGROUND OF THE INVENTION

The present invention relates to etching an etch layer through a mask during the production of a semiconductor device. More specifically, the removal of residue after an etch process.

During semiconductor wafer processing, doped silicon oxide layers are used to provide low-k dielectric layers. During the formation of high aspect ratio contacts in doped silicon oxide layers, residues may be deposited at the bottom of such contacts.

SUMMARY OF THE INVENTION

To achieve the foregoing and in accordance with the purpose of the present invention, a method for removing silicon oxide based residue from a stack with a doped silicon oxide layer with features with diameters less than 100 nm is provided. A wet clean solution of between 25% to 60% by weight of $NH_4F$, and between 0.05% and 5% by weight of phosphoric acid, and between 0.05% and 5% by weight citric acid, in a water solvent to is provided to an area on a surface of the stack. The wet clean solution is removed from the area on the surface of the stack between 0.5 to 10 seconds after the area on the surface of the stack was exposed to the wet clean solution.

In another manifestation of the invention a method for removing silicon oxide based residue from a stack with a doped silicon oxide layer with features with diameters less than 100 nm, wherein the features have an aspect ratio of greater than 15:1 is provided. The stack is placed in a proximity head device, with a proximity head. An HF free wet clean solution of between 25% to 60% by weight of $NH_4F$, and between 0.05% and 5% by weight of phosphoric acid, and between 0.05% and 5% by weight citric acid, in a water solvent is provided through the proximity head to an area on a surface of the stack. The wet clean solution is removed through the proximity head from the area on the surface of the stack between 0.5 to 10 seconds after the area on the surface of the stack was exposed to the wet clean solution.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1A:
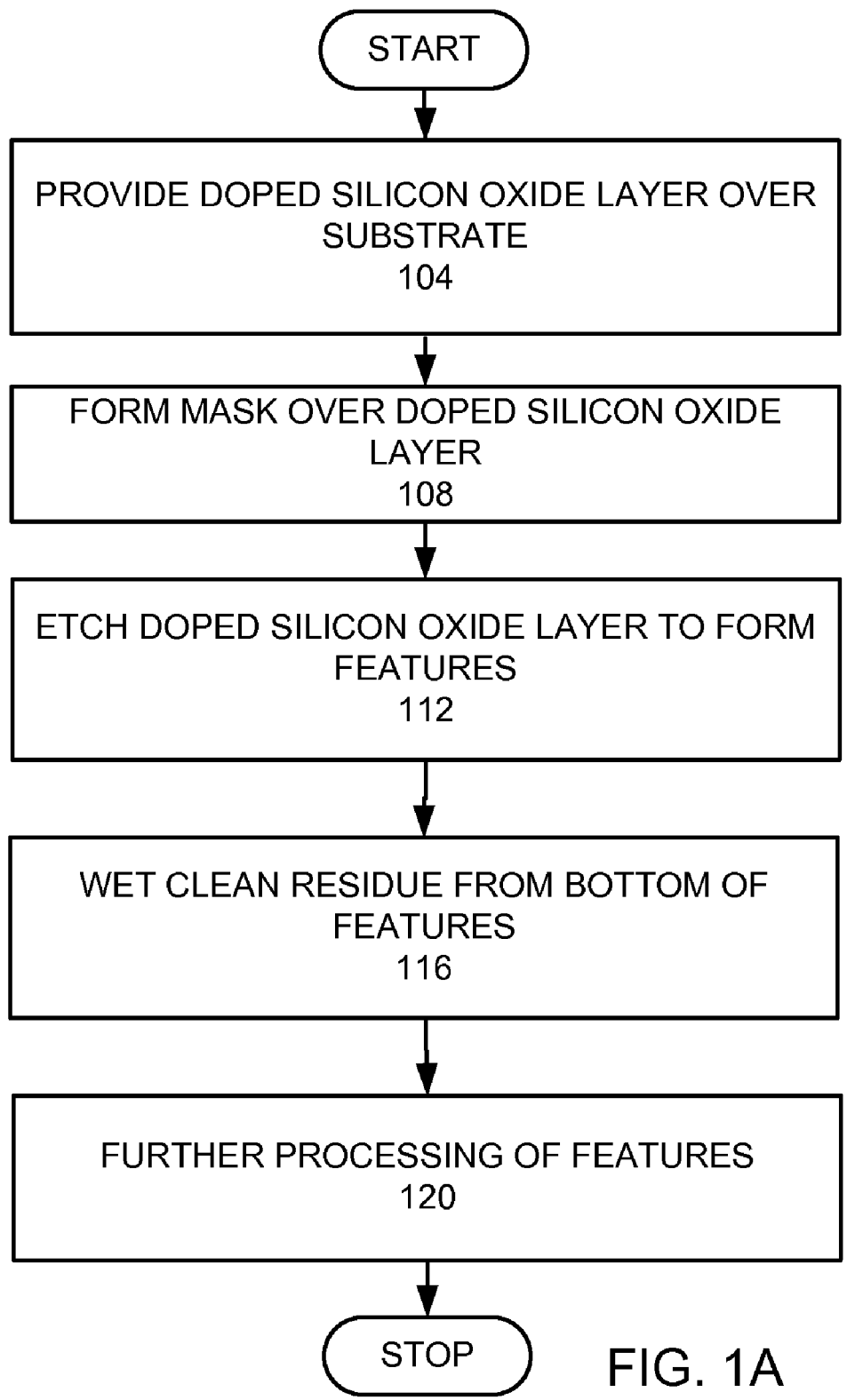
FIGS. 1A-B are high level flow charts of an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As semiconductor devices become smaller and smaller, it is getting significantly more difficult to remove contamination from device features without causing unwanted effects. Removing residues from the semiconductor contacts represents a challenge to cleaning applications. As feature diameters become smaller and smaller, the height of such features in some cases are becoming larger. For example, for some devices, diameters of contact holes may be less than 50 nm and may have an aspect ratio (height to width) of greater than 10. In another example, the contacts may have a diameter of less than 100 nm and a height to depth aspect ratio of greater than 5:1. More preferably, the aspect ratio is greater than 15:1. As contacts are made through dielectric material with reactive ion etch technology, residues are left on the sidewall and bottom of the contacts after the dry etch. These residues need to be removed by a wet clean.

Some of the challenges of such wet cleans are the need to get fluids to the bottom of the high aspect ratio features, the need to fully remove chemistry and rinse at the bottom of the features, and the need to provide good selectivity to prevent undercut and CD loss. Failure to achieve these challenges may leave residue, which may cause shorts, re-deposit residues and/or cause CD blowout, and may impact subsequent filling adhesion and contact shorts.

Chemicals required for residue removal may also attack the sidewall of the contact and cause contact blowout and eventually contact shorts. In order to prevent this unwanted effect, the wet etch chemicals need to remove residues, while minimizing the etching of the contact sidewalls. In the embodiments of the invention, the contact sidewalls are made of doped silicon oxide layers, such as borophosphosilicate glass (BPSG) and/or phosphosilicate glass (PSG) and/or spin-on dielectric (SOD), which are used to provide low-k dielectric layers. Sidewall and bottom residues are often equivalent to thermal silicon oxide in their removal characteristics, thus residue removal is often normalized to equivalent to thermal silicon oxide (TOX) removal targeted for the clean step. Minimizing the doped silicon oxide etch rate and maximizing the undoped silicon oxide rate is provided by a preferred embodiment of the invention. The ratio of the doped to undoped silicon oxides etch rates is called selectivity. Target selectivity values are less than 1, however, these targets cannot be achieved due to the chemical nature of the oxides and the optimized chemistries of certain wet cleans.

Some chemistries that were used in the past for contact clean are no longer useful because their high etch rate does not allow them to meet reduced thermal oxide targets used in spin or batch clean tools. Diluting such chemicals to reduce the etch rate is not feasible, as dilution deteriorates selectivity performance. In the use of HF for a wet clean, the HF can be diluted to meet TOX removal targets, but results in a poor selectivity.

Figure 1B:
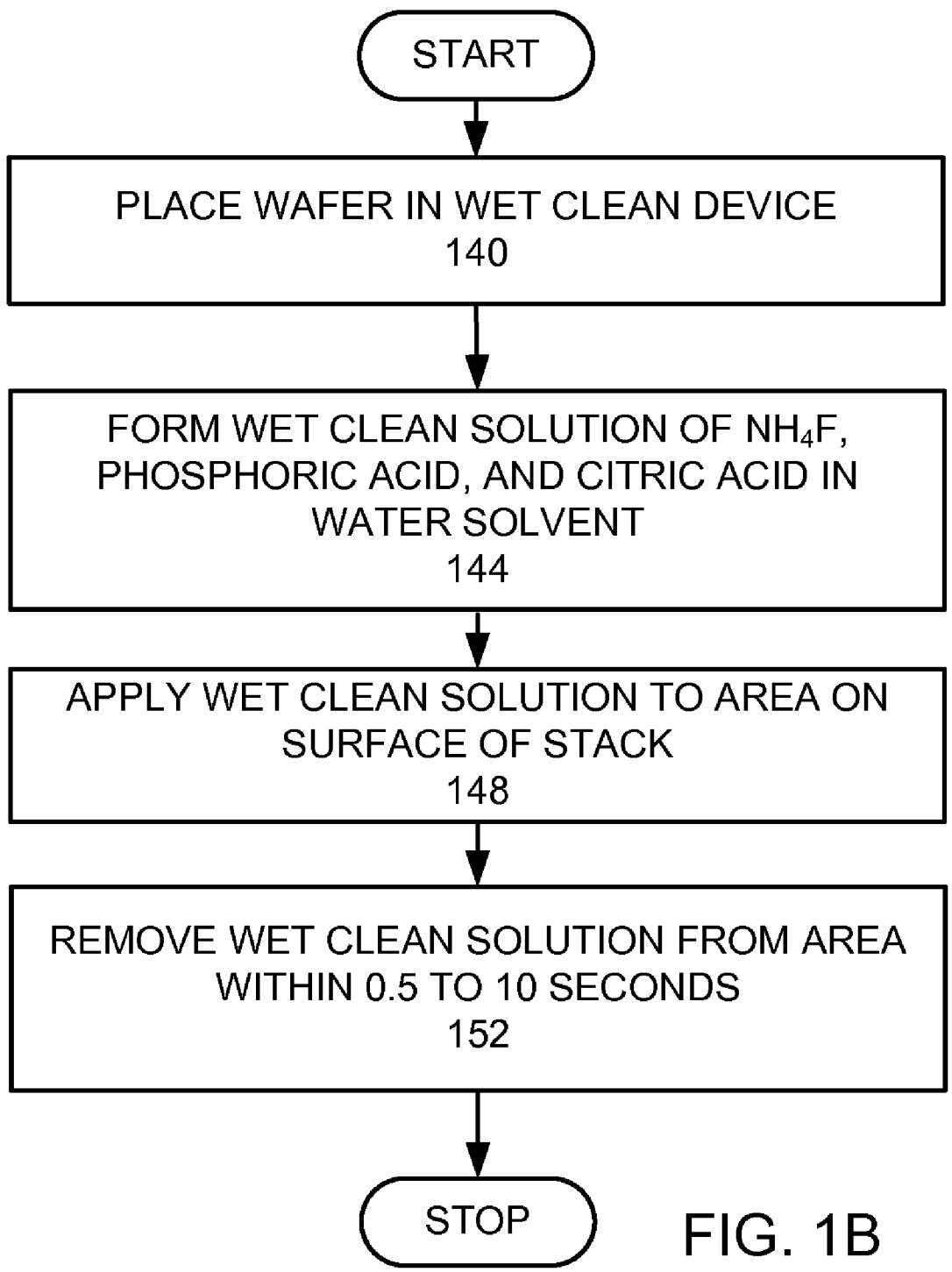

To facilitate understanding, FIG. 1A is a high level flow chart of a process used in an embodiment of the invention. A doped silicon oxide layer is provided over a substrate (step 104). The doped silicon oxide layer may have a dopant in the range of 2% to 8%. More generally, the dopant is at least 2%. A mask is formed over the doped silicon oxide layer (step 108). The doped silicon oxide layer is etched to form features (step 112). A wet clean is used to remove residue from the bottom of the features (step 116). FIG. 1B is a more detailed flow chart of the wet clean (step 116). During this step, the wafer is placed in a wet clean device (step 140). A wet clean solution is formed comprising $NH_4F$, phosphoric acid, and citric acid in a water solvent (step 144). Preferably, the wet clean solution is between 25% to 60% by weight of $NH_4F$, and between 0.05% to 5% by weight phosphoric acid, and between 0.05% and 5% by weight citric acid in a water solvent. The wet clean solution is applied to an area on the surface of the stack (step 148). The wet clean solution is removed from the area within 0.5 to 10 seconds after it is applied (step 152) by DIW rinse and dry. The wet clean step (step 116) is then completed. Further processing of the features may be performed (step 120).

EXAMPLE

Figure 2A:
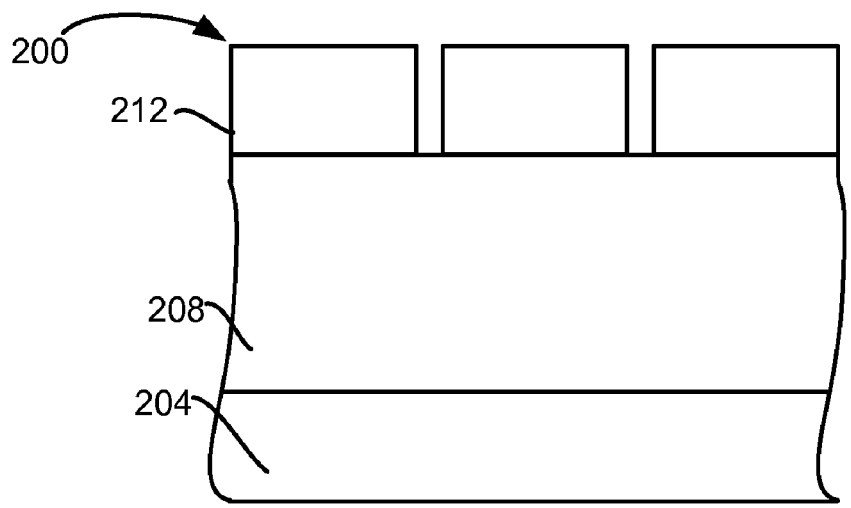
FIGS. 2A-C are schematic views of a stack processed according to an embodiment of the invention.
Figure 2B:
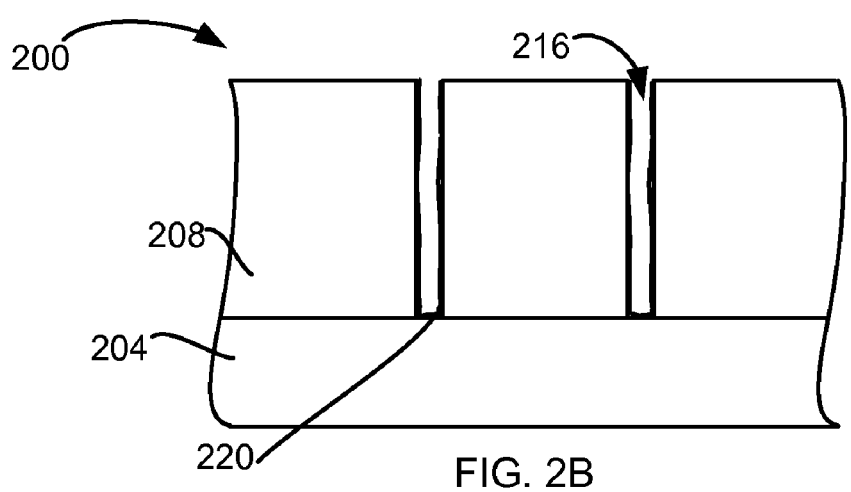

In a first example of the invention, the doped silicon oxide layer is a borophosphosilicate glass (BPSG) formed over a substrate (step 104). FIG. 2A is a cross-sectional view of a stack 200 with a substrate 204 over which a BPSG layer 208 is formed. A mask 212 is formed over the BPSG layer 208 (step 108). In this example, the mask is a photoresist mask. The BPSG layer is etched to form features (step 112). A conventional BPSG layer etch may be used. FIG. 2B is a cross-sectional view of the stack 200 after the BPSG layer is etch, using a dry plasma etch to form features 216. In this embodiment, the features are contacts with an aspect ratio of height to depth of greater than 10:1 and a width of less than 50 nm. The plasma etch forms a residue 220 on the sidewalls and at the bottom of the features. A wet clean is used to remove residue from the sidewall and bottom of the features (step 116). It has been found that these residue, both at sidewalls and at the bottom of the features, have wet etch properties close to those of undoped thermal oxides, which are more resistant to removal than doped oxides.

Figure 3:
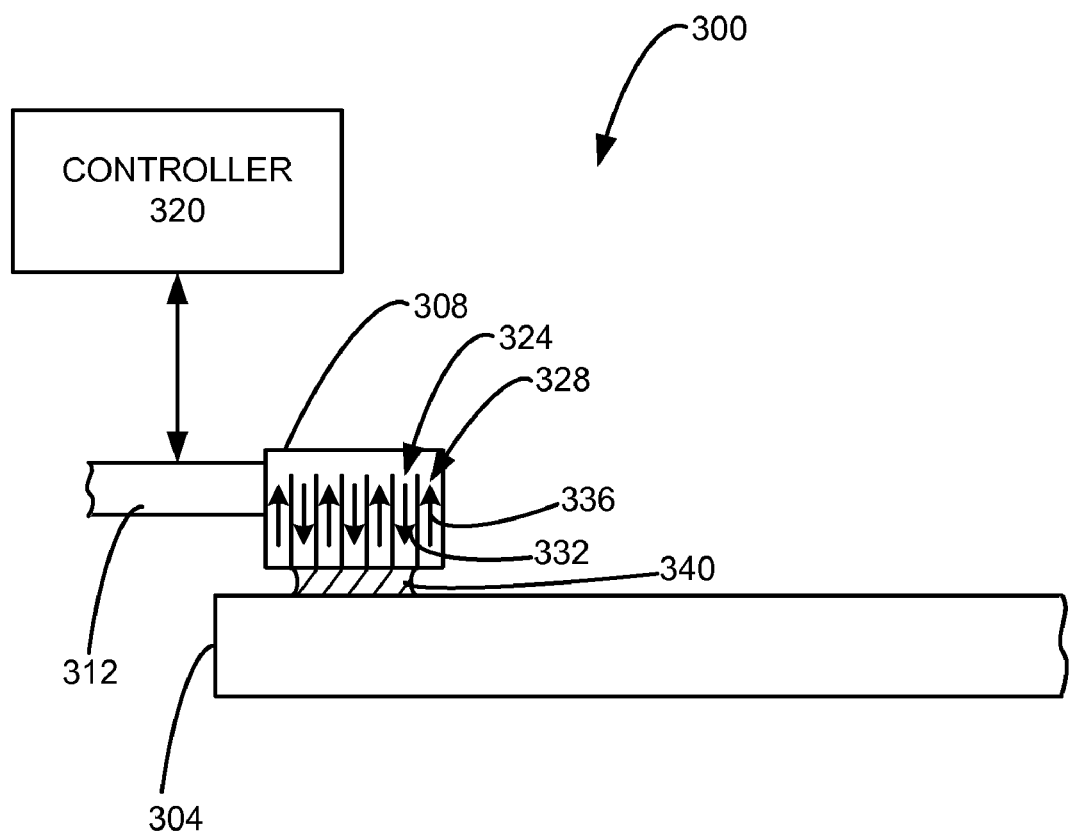
FIG. 3 is a schematic view of a wet clean device used in an embodiment of the invention.

The wafer is placed in a wet clean device (step 140). FIG. 3 is a schematic view of a cross-sectional view of part of a wafer 304 in a wet clean device 300 with a proximity head 308, held by a support 312, which is controlled by a controller 320. The proximity head 308 provides a plurality of fluid inlets 324 and fluid outlets 328. The fluid inlets 324 provide a processing fluid inflow 332. The fluid inflow 332 creates a meniscus 340 between the proximity head 308 and a portion of the wafer 304. The fluid outlets 328 provide a vacuum, which creates a processing fluid outflow 336. The vacuum both removes used fluid from the wafer 304 and dries the wafer 304. In the preferred embodiment, the wet clean device is one of the 2300 Clean systems (Serene or C360) by Lam Research Corp. of Fremont, Calif.

Figure 4A:
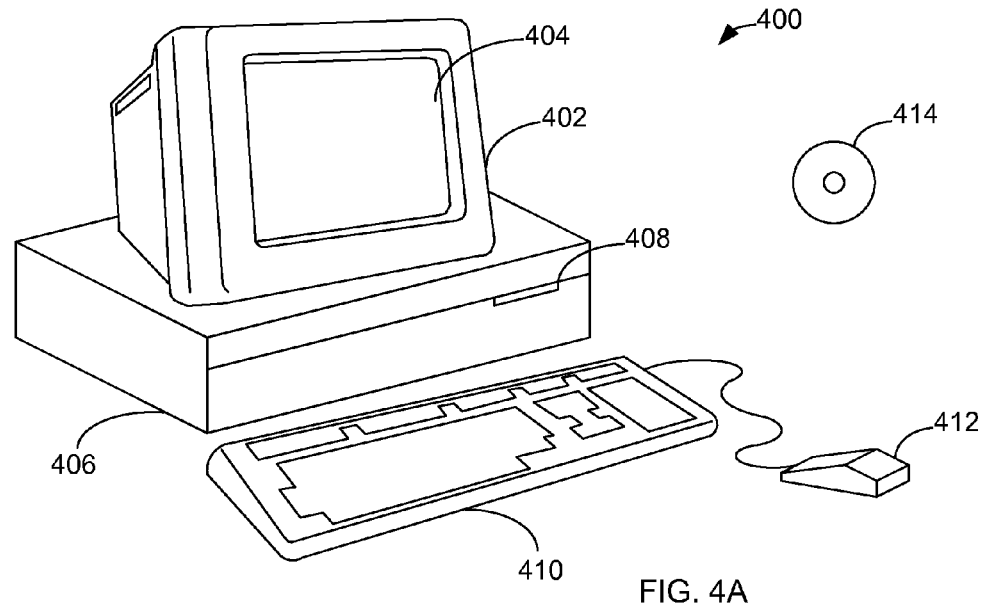
FIGS. 4A-B illustrate a computer system, which is suitable for implementing a controller used in embodiments of the present invention.
Figure 4B:
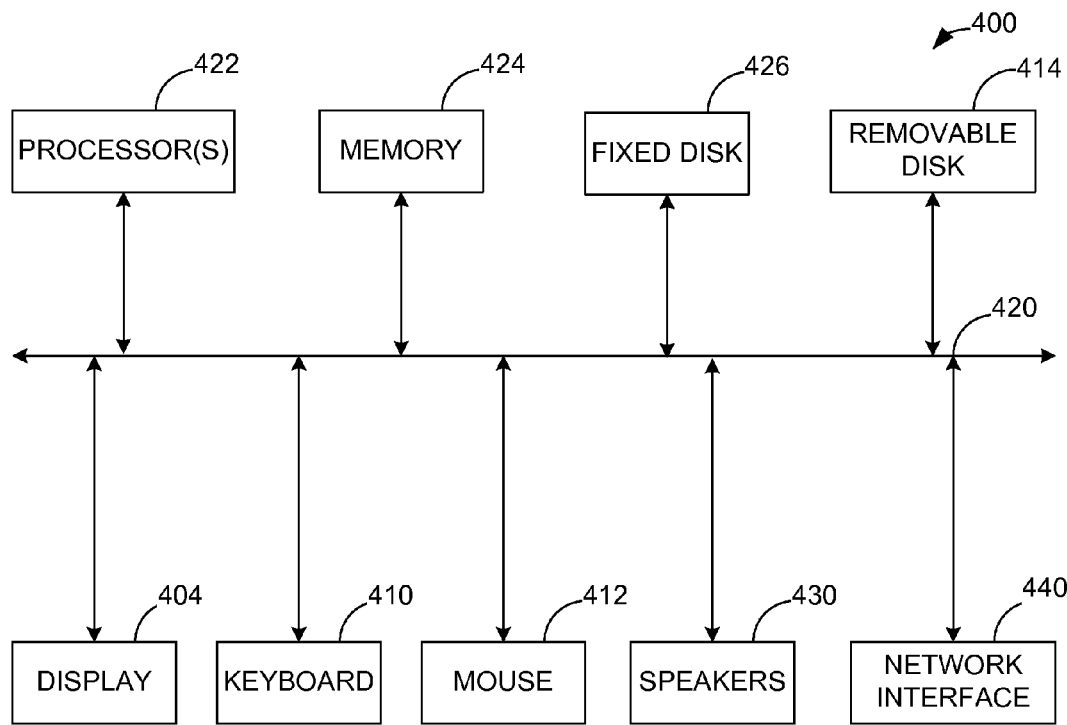

FIGS. 4A and 4B illustrate a computer system, which is suitable for implementing the controller 320 used in one or more embodiments of the present invention. FIG. 4A shows one possible physical form of the computer system 400. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 is also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

A wet clean solution is formed comprising $NH_4F$, phosphoric acid, and citric acid in a water solvent (step 144). Preferably, the wet clean solution is between 25% to 60% by weight of $NH_4F$, and between 0.05% and 5% by weight phosphoric acid, and between 0.05% and 5% by weight citric acid in a water solvent. More preferably, the wet clean solution is 30%-42% by weight $NH_4F$, 0.1%-3% by weight phosphoric acid, and 0.1%-3% citric acid, with the remainder being deionized water. In an example of forming the wet clean solution 89.8 ml of a 40% concentration of $NH_4F$ with a density of 1.110 g/ml is mixed with 0.089 ml of a 96% concentration of a phosphoric acid solution with a density of 1.685 g/ml. 0.15 g of citric acid monohydrate salt is added to provide a mixture of 0.15% by weight of citric acid, 0.15% by weight of phosphoric acid, and about 40% by weight of $NH_4F$.

Figure 2C:
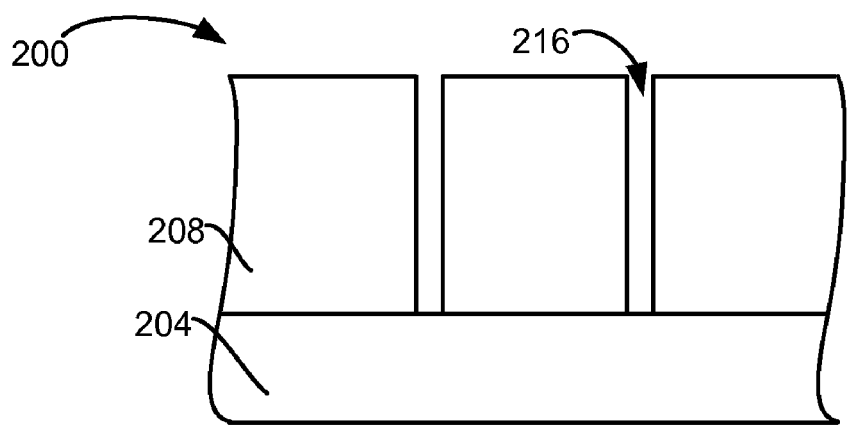

The wet clean solution is applied to an area on the surface of the stack (step 148). In this example, the fluid inlets 324 provide the wet clean solution through the proximity head 308 to the wafer 304, forming the meniscus 340. The wet clean solution is removed from the area within 0.5 to 10 seconds after it is applied (step 152). Preferably, the wet clean solution is removed from the area on the wafer within 1 to 5 seconds after it is applied and the proximity head 308 is moved with respect to the surface of the wafer at such a speed, so that an area of the stack is not exposed to the wet clean solution for more than 5 seconds. In this example, the wet clean solution is removed from the meniscus 340 through the fluid outlets 328. In addition, the controller 320 and support 312 move the proximity head 308, or the wafer 304 is moved so that one area of the wafer is not exposed to the wet clean solution for more than two seconds. The wet clean step (step 116) is then completed. FIG. 2C is a cross-sectional view of the stack after the wet clean has been completed. The inventive process allows the approximately 1 Å of residue on the bottom of the features with thermal oxide etch properties to be removed while removing minimal amounts of the doped silicon oxide layer, in a process that uses a proximity head, which provides an area of the wafer with exposure to the wet clean solution for between 0.5 and 10 seconds. More generally, a preferred embodiment of the invention removes 0.25 Å to 2 Å of residue at the bottom of the features.

Further processing of the features may be performed (step 120). Such further processing steps may fill the features with metal to form metal contacts.

The etch rate selectivity of doped oxide to thermal oxide (undoped) is 1.5:1 to 3.5:1, depending on the dopant level. Some prior art chemistries have selectivities of 10:1 to 20:1. Since the residue with thermal oxide properties on the bottom of the features is no more than 2 Å, a highly selective and slow etching solution is desired.

Some chemistries in the prior art etch thermal oxides too fast, which may be on the order of 10 Å per second. Such prior art chemistries would etch too much if applied to the stack for even a second. Diluting such chemistries or reducing the amount of HF in a chemistry may be used to reduce the etch rate. It has been found that using pure ammonium fluoride, without HF provides an etch rate on the order of 0.5 Å/sec. With a 30 second exposure time, typical for conventional single wafer spin or wet bench systems, 15 Å would be removed, which is much more than the desired less than 2 Å. It has been found that reducing the etch rate by diluting a solution reduces selectivity in such a way that too much of the doped silicon oxide is etched during the removal of the residue. In addition, longer exposure times may increase undercutting. Therefore, in the preferred embodiment, the wet clean solution is HF free.

The inventive combination of exposure time, selectivity, and etch rate provides sufficient etching to remove the residue at the bottom of the features with thermal oxide etch properties with minimal removal of the doped silicon oxide layer. For example, it has been found that HF solutions with short exposure times have not provided satisfactory results. In a preferred embodiment of the invention, the wet clean solution has a doped silicon oxide to thermal oxide selectivity of between 1.5:1 to 3.5:1. In addition, the wet clean solution has a thermal oxide etch rate of between 0.2 A/s and 0.4 A/s.

Without being bound by theory, it is believed that the citric acid and phosphoric acid slows the etch rate of the doped silicon oxide to improve the selectivity. More specifically, it is believed that the phosphoric acid reduces the etch rate of the doped silicon oxide. An increase in phosphoric acid increases the over all etch rate, while maintaining selectivity. It was unexpectedly found that both citric acid and phosphoric acid are needed for the selectivity.

Such a chemical combination took about 10 months of searching and hiring multiple chemical research firms. The chemical research firms were not successful in finding a suitable chemistry. Such a chemistry was found after outside research firms were unable to do so.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for removing silicon oxide based residue from a stack with a doped silicon oxide layer with features with diameters less than 100 nm, comprising:
   providing a wet clean solution of between 25% to 60% by weight of $NH_4F$, and between 0.05% and 5% by weight of phosphoric acid, and between 0.05% and 5% by weight citric acid, in a water solvent to an area on a surface of the stack; and
   removing the wet clean solution from the area on the surface of the stack between 0.5 to 10 seconds after the area on the surface of the stack was exposed to the wet clean solution.

2. The method, as recited in claim 1, wherein the features have aspect ratios greater than 5:1.

3. The method, as recited in claim 2, further comprising placing the stack in a proximity head device, wherein the proximity head provides the wet clean solution and removes the wet clean solution.

4. The method, as recited in claim 3, wherein between 0.25 Å to 2 Å of residue is removed from bottoms of the features.

5. The method, as recited in claim 4, wherein the wet clean solution is HF free.

6. The method, as recited in claim 5, wherein the wet clean solution has a dope silicon oxide to thermal silicon oxide selectivity of between 1.5:1 to 3.5:1.

7. The method, as recited in claim 6, wherein the wet clean solution has an etch rate of between 0.2 Å/s and 0.4 Å/s.

8. The method as recited in claim 7, wherein an area on the surface of the stack is exposed to the wet clean solution for a period of between 1 to 5 seconds.

9. The method, as recited in claim 8, further comprising:
   providing a photoresist mask over the doped silicon oxide layer; and
   etching features into the doped silicon oxide, creating residue in the features, wherein residue at bottoms of the features have thermal oxide etch properties.

10. The method, as recited in claim 9, wherein the features have aspect ratios greater than 15:1.

11. The method, as recited in claim 1, further comprising placing the stack in a proximity head device, wherein the proximity head provides the wet clean solution and removes the wet clean solution.

12. The method, as recited in claim 1, wherein the wet clean solution is HF free.

13. The method, as recited in claim 1, wherein the wet clean solution has a dope silicon oxide to thermal silicon oxide selectivity of between 1.5:1 to 3.5:1.

14. The method, as recited in claim 1, wherein the wet clean solution has an etch rate of between 0.2 Å/s and 0.4 Å/s.

15. The method as recited in claim 1, wherein an area on the surface of the stack is exposed to the wet clean solution for a period of between 1 to 5 seconds.

16. The method, as recited in claim 1, further comprising:
providing a photoresist mask over the doped silicon oxide layer; and
etching features into the doped silicon oxide, creating residue in the features, wherein residue at bottoms of the features have thermal oxide etch properties.

17. The method, as recited in claim 1, wherein the features have aspect ratios greater than 15:1.

18. A method for removing silicon oxide based residue from a stack with a doped silicon oxide layer with features with diameters less than 100 nm, wherein the features have an aspect ratio of greater than 15:1, comprising:
placing the stack in a proximity head device, with a proximity head;
providing through the proximity head an HF free wet clean solution of between 25% to 60% by weight of $NH_4F$, and between 0.05% and 5% by weight of phosphoric acid, and between 0.05% and 5% by weight citric acid, in a water solvent to an area on a surface of the stack; and
removing through the proximity head the wet clean solution from the area on the surface of the stack between 0.5 to 10 seconds after the area on the surface of the stack was exposed to the wet clean solution.

* * * * *